United States Patent
Sobhani

(10) Patent No.: US 7,348,664 B2
(45) Date of Patent: Mar. 25, 2008

(54) SEMICONDUCTOR APPARATUS HAVING A COOLING APPARATUS THAT COMPRESSIVELY ENGAGES A SEMICONDUCTOR DEVICE

(75) Inventor: Seyd M. Sobhani, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/133,683

(22) Filed: May 20, 2005

(65) Prior Publication Data
US 2006/0261468 A1    Nov. 23, 2006

(51) Int. Cl.
*H01L 23/34* (2006.01)
(52) U.S. Cl. .............................. 257/712; 257/E23.021; 257/E23.044; 257/E23.046; 257/E23.054; 257/717; 257/718; 257/719
(58) Field of Classification Search ........ 257/E23.021, 257/E23.044, E23.046, E23.054, 712, 717, 257/718, 719
See application file for complete search history.

(56) References Cited

U.S. PATENT DOCUMENTS

| | | | |
|---|---|---|---|
| 6,442,033 B1 * | 8/2002 | Liu et al. ................... | 361/743 |
| 6,452,261 B1 * | 9/2002 | Kodama et al. ............ | 257/688 |
| 6,770,986 B2 * | 8/2004 | Nagao et al. ............... | 307/326 |
| 6,774,466 B1 * | 8/2004 | Kajiwara et al. ........... | 257/673 |
| 2002/0145188 A1 * | 10/2002 | Kodama et al. ............ | 257/678 |

\* cited by examiner

*Primary Examiner*—Alexander Oscar Williams
(74) *Attorney, Agent, or Firm*—Alston & Bird LLP

(57) ABSTRACT

A semiconductor device comprises a semiconductor die, first and second electrically-conductive leads and first and second thermal elements. The die comprises first and second surfaces. The first lead is held in contact with the first surface of the die by a compressive force. The first thermal element is held in contact with a portion of the first lead by a compressive force such that the first thermal element is capable of removing heat from the first lead and from the die. The second lead is held in contact with the second surface of the die by a compressive force. The second thermal element is held in contact with a portion of the second lead by a compressive force such that the second thermal element is capable of removing heat from the second lead and from the die.

12 Claims, 6 Drawing Sheets

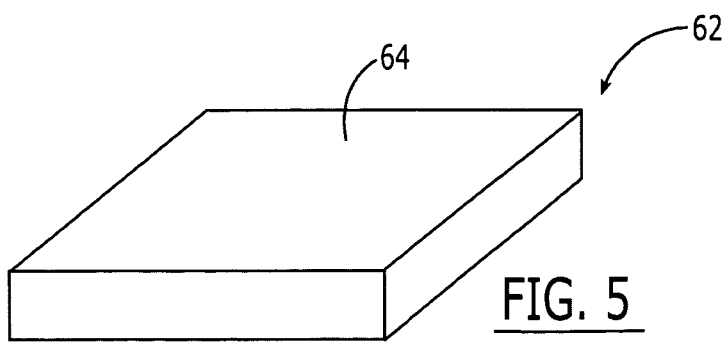
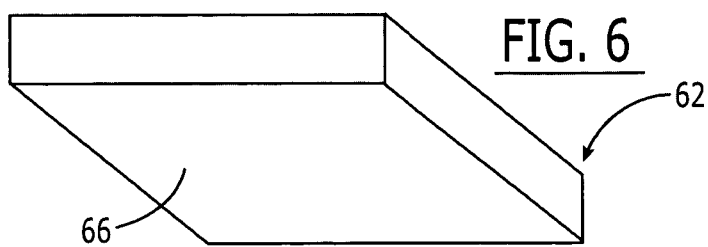
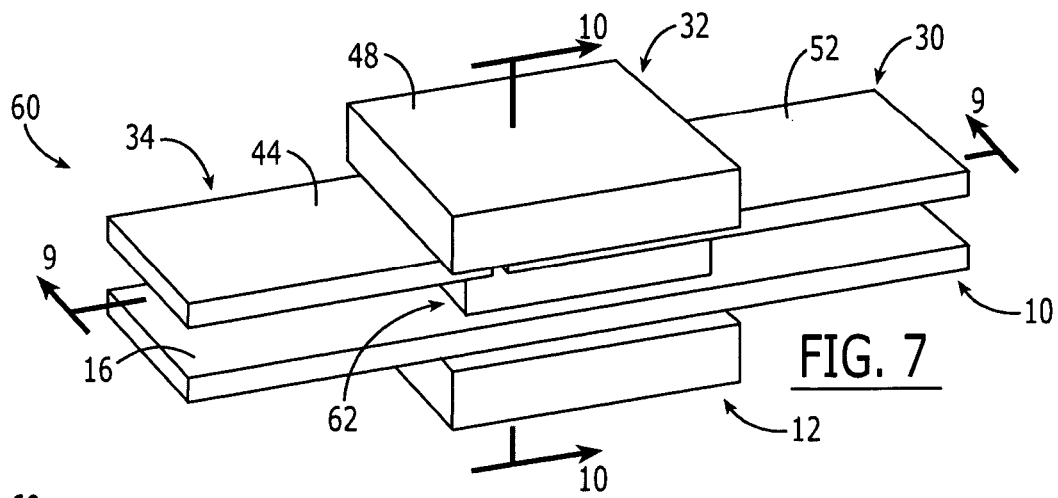
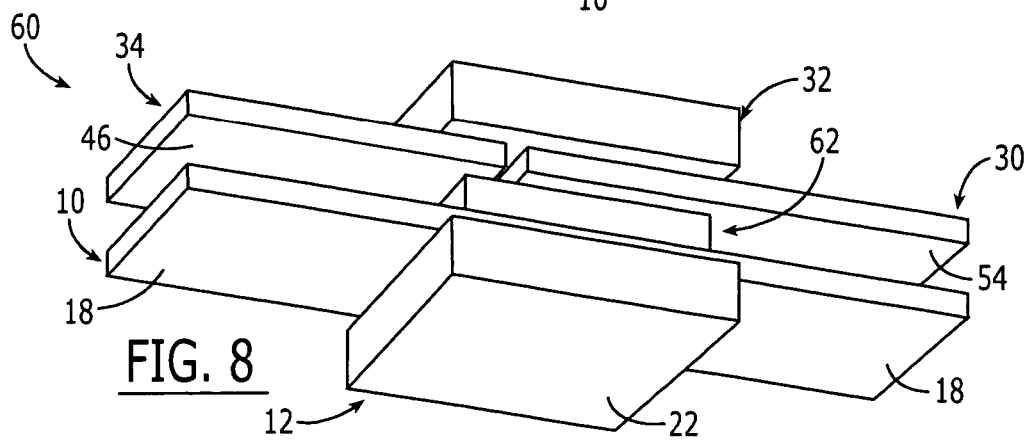

SEMICONDUCTOR APPARATUS HAVING A COOLING APPARATUS THAT COMPRESSIVELY ENGAGES A SEMICONDUCTOR DEVICE

FIELD OF THE INVENTION

The present invention relates generally to semiconductor devices, and more particularly, to semiconductor devices capable of being cooled from two sides and cooling apparatuses for such devices.

BACKGROUND OF THE INVENTION

Any semiconductor die that produces a large amount of heat, such as a power semiconductor die, a data processor die, a memory die, etc., is limited by the rate at which heat can be dissipated from it.

When a die processes more power and/or data, the die produces more heat. To keep the temperature of a die under the failure value, heat has to be dissipated from the die at the fastest possible rate. Therefore, the density of power and/or data processing is limited by the rate at which heat can be dissipated from these dies. Conversely, more power and/or data can be processed by a die if the rate of heat dissipation from the die can be increased.

The amount of power and/or data that a die processes is limited by the amount of heat that can be dissipated from the die using the conventional heat-dissipation techniques. One known technique for dissipating heat from a power semiconductor is to bond the semiconductor die to a thermally-conductive, electrically-insulative substrate, such as a ceramic substrate. The ceramic layer is typically mounted on a metallic substrate, which may be mounted on an actively cooled device, such as a cold plate. Heat from the semiconductor is transferred to the ceramic substrate and then to the cold plate. One limitation of this known technique for dissipating heat is that heat is only removed from one side of the semiconductor, i.e., the side bonded to the thermally-conductive, electrically-insulative substrate.

The bonding of the semiconductor die to the thermally-conductive, electrically-insulative substrate may cause heat-related problems. Unless the thermally-conductive, electrically-insulative substrate and the semiconductor die are made of materials with identical expansion coefficients, the heat generated in the semiconductor device will cause the substrate and the semiconductor die to expand at differing amounts and at differing rates. This differing expansion may cause physical stresses that may eventually damage the semiconductor assembly.

Another heat and bonding related problem may result where the electrical leads, such as the gate and source wires, are connected to the semiconductor die. The leads and the die are typically connected using an inelastic bonding method, such as welding. The electrical leads are typically thin wires that are vibration welded to the metallized surface of the semiconductor die. Because the lead wires are thin, the area where the lead wires are welded to the semiconductor die (i.e., the bonding point) is small. As a large amount of current would typically flow through the small bonding point (this may be termed current crowding at a singularity point), the temperature excursion that occurs at the bonding point is greater than the temperature excursion that occurs in the other areas of the semiconductor die. As a result, greater expansion occurs at the bonding point, increasing the physical stress and increasing the likelihood of failure of the weld, the lead, and/or the die.

As such, there is a need for a semiconductor device and cooling apparatus that enables greater heat dissipation to enable increased power/data flow and which eliminates inelastic bonding to thereby decrease the likelihood of failure due to physical stress caused by the expansion of dissimilar materials.

BRIEF SUMMARY OF THE INVENTION

A semiconductor device and cooling apparatus are therefore provided in which the components of the semiconductor device are held together by a compressive force applied by the cooling apparatus, thereby eliminating the need for inelastic bonding of the components and enabling heat dissipation from two sides of the semiconductor device.

In this regard, a semiconductor device comprises a semiconductor die, first and second electrically-conductive leads, and first and second thermally-conductive, electrically-insulative elements. The semiconductor die comprises at least first and second surfaces. The first electrically-conductive lead is held in contact with the first surface of the semiconductor die by a compressive force. The first thermally-conductive, electrically-insulative element is held in contact with a portion of the first electrically-conductive lead by a compressive force such that the first thermally-conductive, electrically-insulative element is capable of removing heat from the first electrically-conductive lead and from the semiconductor die. The second electrically-conductive lead is held in contact with the second surface of the semiconductor die by a compressive force. The second thermally-conductive, electrically-insulative element is held in contact with a portion of the second electrically-conductive lead by a compressive force such that the second thermally-conductive, electrically-insulative element is capable of removing heat from the second electrically-conductive lead and from the semiconductor die.

The semiconductor device may further comprise a third electrically-conductive lead held in contact with the second surface of the semiconductor die by a compressive force. In such an embodiment, the second thermally-conductive, electrically-insulative element is held in contact with a portion of the third electrically-conductive lead by a compressive force such that the second thermally-conductive, electrically-insulative element is capable of removing heat from the third electrically-conductive lead.

In one embodiment, the first electrically-conductive lead is capable of functioning as a semiconductor drain, the second electrically-conductive lead is capable of functioning as a semiconductor gate, and the third electrically-conductive lead is capable of functioning as a semiconductor source. In another embodiment, the first electrically-conductive lead is capable of functioning as a semiconductor collector, the second electrically-conductive lead is capable of functioning as a semiconductor base, and the third electrically-conductive lead is capable of functioning as a semiconductor emitter.

The second and third electrically-conductive leads may each comprise a plurality of extensions, such that the extensions of the second electrically-conductive lead are interlaced with the extensions of the third electrically-conductive lead.

In one embodiment, the portion of the first electrically-conductive lead that is held in contact with the first surface of the semiconductor die is recessed to accept the first surface of the semiconductor die, and the portions of the second and third electrically-conductive leads that are held in contact with the second surface of the semiconductor die are recessed to accept the second surface of the semiconductor die.

The first thermally-conductive, electrically-insulative element may be adhesively affixed to the portion of the first electrically-conductive lead, and the second thermally-conductive, electrically-insulative element may be adhesively affixed to both the portion of the second electrically-conductive lead and the portion of the third electrically-conductive lead.

A semiconductor cooling apparatus comprises an inner surface, an outer surface, a flexible element, and a cooling medium. The inner surface defines a void. The outer surface surrounds the inner surface such that the inner surface and the outer surface define a cavity between the inner surface and the outer surface. The cooling medium is within the cavity defined between the inner surface and the outer surface. A perimeter of the flexible element is affixed to a perimeter of an opening defined by the inner surface. The void defined by the inner surface is capable of receiving a semiconductor device such that one surface of the semiconductor device is in contact with the flexible element. The cooling medium within the cavity causes the flexible element to flex toward the semiconductor device to apply a compressive force to the semiconductor device so as to retain the semiconductor device within the void. Heat generated by electrical current flowing through the semiconductor device is transferred through the flexible element to the cooling medium.

The semiconductor cooling apparatus may further comprise a second flexible element. A perimeter of the second flexible element may be affixed to a perimeter of another opening defined by the inner surface such that another surface of the semiconductor device may be in contact with the second flexible element. The cooling medium within the cavity may cause the second flexible element to flex toward the semiconductor device to apply a compressive force to the semiconductor device. Heat generated by electrical current flowing through the semiconductor device may be transferred through the second flexible element to the cooling medium.

The semiconductor cooling apparatus may further comprise a cold plate in thermal contact with the outer surface such that heat transferred to the cooling medium is further transferred from the cooling medium to the cold plate.

The cooling medium may be selected such that the cooling medium will be partially liquid and partially vapor at an operating temperature range of the semiconductor device.

In one embodiment, the flexible elements each comprise at least one corrugation to enable the flexible elements to flex toward the semiconductor device.

In addition to the semiconductor device and cooling apparatus as described above, other aspects of the present invention are directed to corresponding methods for cooling semiconductor devices.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 5 is a top perspective view of a semiconductor die, according to one embodiment of the invention;

FIG. 6 is a bottom perspective view of a semiconductor die, according to one embodiment of the invention;

FIG. 7 is a top perspective view of a semiconductor device, according to one embodiment of the invention;

FIG. 8 is a bottom perspective view of a semiconductor device, according to one embodiment of the invention;

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The components of the semiconductor device of the illustrated embodiment will generally comprise three electrically-conductive leads ("leads"), two thermally-conductive, electrically-insulative elements ("insulators"), and a semiconductor die. The leads may comprise any suitable electrically-conductive material, such as aluminum, copper, or gold, as is known in the art. The leads will typically have a thickness of approximately 1 to 100 mils (one mil is one thousandth of an inch), although the leads may be differently sized if needed. The three leads may function as a drain, a gate, and a source, respectively, in embodiments in which the semiconductor device is a field effect transistor, a bipolar transistor, or an insulated gate bipolar transistor. Alternatively, the three leads may function as a collector, a base, and an emitter, respectively, in embodiments in which the semiconductor device is a bipolar transistor. For purposes of example but not of limitation, the three leads will be described as a drain, a gate, and a source. The semiconductor device may be other than a transistor, such that the number and function of the leads will vary based on the type of semiconductor die that is used. The insulators may comprise any suitable thermally-conductive, electrically-insulative material, such as ceramic, as is known in the art. The insulators will typically have a thickness of approximately 1 to 10 mils, although the insulators may be differently sized if needed. The semiconductor die may comprise any suitable semiconductor material, such as silicon or silicon carbide, as is known in the art. The semiconductor die will typically have a parallelepipedal shape, measuring approximately 10 mils by 500 mils by 800 mils in one embodiment but having different sizes and shapes in other embodiments. As will be discussed in detail below, the components of the semiconductor device may be held together with a compressive force, typically applied by internal pressure of the working liquid of a cooling apparatus, such as a heat pipe.

Figure 1:
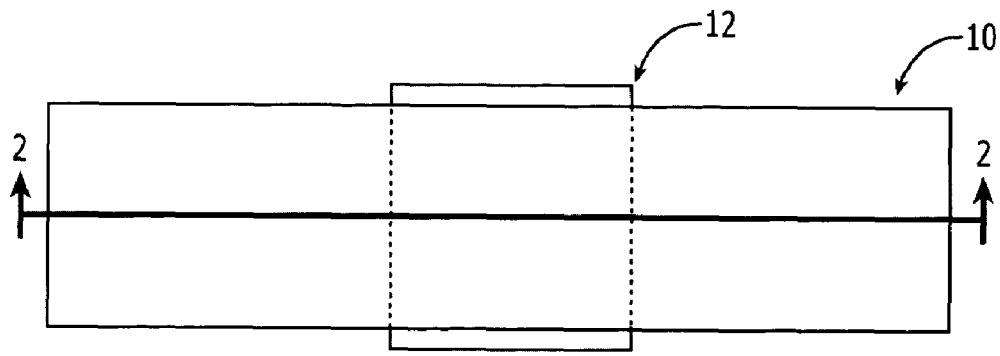
FIG. 1 is a top view of a drain lead and an insulator of a semiconductor device, according to one embodiment of the invention.
Figure 2:
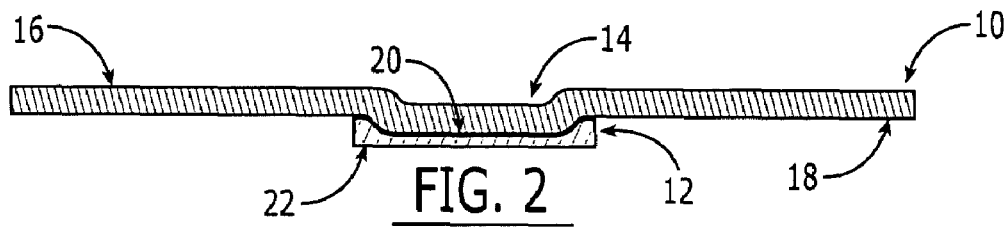
FIG. 2 is a front side view of the drain lead and insulator of FIG. 1.

FIG. 1 is a top view of a drain lead and associated insulator of a semiconductor device, according to one embodiment of the invention. While orientational designations such as top, bottom, and front are used in this application, these orientational designations are used for purposes of example and explanation and not of limitation since other orientations are also supported. As shown in FIG. 1, the drain lead 10 will typically comprise a generally rectangular strip of metal. The insulator 12 may be adhesively affixed to the drain lead 12, at approximately the center of the drain lead. FIG. 2 is a front side view of the drain lead and insulator of FIG. 1. As shown in FIG. 2, a shallow (1-2 mil deep) recess 14 may be formed in the top surface 16 of the drain lead 10, in approximately the center of the drain lead. The recess 14 may be formed by etching, stamping, or any other suitable method. The length and width of the shallow recess will typically be slightly larger than the length and width of the semiconductor die, such that a portion of the semiconductor die (i.e., the bottom surface) will fit within the recess when the components are assembled and compressive force is applied, thereby restricting movement of the die relative to the drain lead and reducing the compressive force required to hold the components together. Depending on the method used to form the recess in the drain lead, the side of the drain lead that is not adjacent to the semiconductor die and is adjacent to the insulator 12 when the semiconductor device is assembled (i.e., the bottom surface 18 of the drain lead) may form a projection corresponding to the recess that is formed on the side that is adjacent to the semiconductor die. For example, if the recess is formed by stamping, the side opposite the recess would typically form a corresponding projection. The recess 14 of the drain lead 10 of FIG. 2 illustrates a recess that may be formed by stamping, such that the side opposite the recess (i.e., the bottom surface 18) forms a projection. If the recess is formed by etching, the side opposite the recess would typically be flat.

The surface 20 of the insulator 12 that is adjacent to the side of the drain lead opposite the recess may also have a shallow recess. The insulator would typically have a recess if the drain lead has a projection, such that the projection of the drain lead will fit within the recess of the insulator when the components are assembled and compressive force is applied, thereby restricting movement of the insulator relative to the drain lead and reducing the compressive force required to hold the components together. FIG. 2 illustrates an insulator that has a recess to accept a projection of the drain lead.

Figure 3:
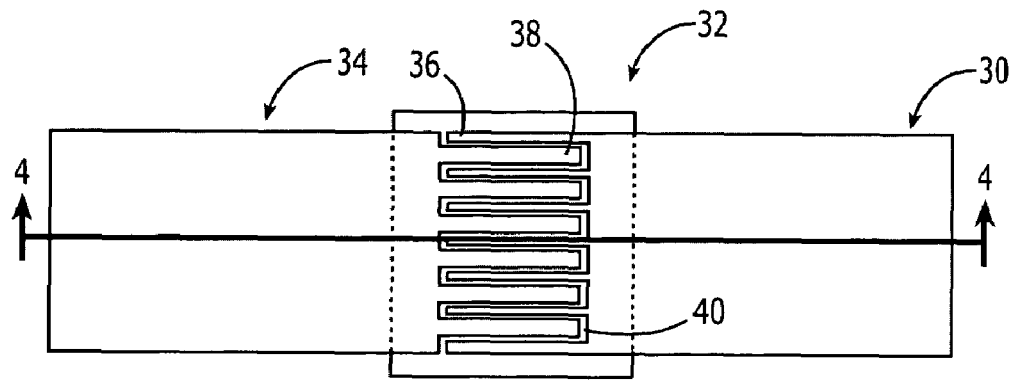
FIG. 3 is a bottom view of source and gate leads and an insulator of a semiconductor device, according to one embodiment of the invention.

FIG. 3 is a bottom view of source and gate leads and an insulator of a semiconductor device, according to one embodiment of the invention. The source lead 34 and the gate lead 30 will typically be formed from a single, generally rectangular, strip of metal of similar size as the drain lead. A portion of the single strip of metal will be removed, using a technique such as photo-etching or any other suitable technique, to create a gap 40 and thereby form the two separate leads. The removal of a portion of the metal strip will typically form a series of extensions on both the source lead and the gate lead. The extensions 38 on the source lead will typically be interlaced with the extensions 36 on the gate lead, as shown in FIG. 3. The extensions on the source lead will typically be wider than the extensions on the gate lead. The extensions 38 on the source lead may have a width of approximately 30 mils (depending on the size of the die), and the extensions 36 on the gate lead may have a width of approximately 1 mil (depending on the size of the die). The extensions of both the source lead and the gate lead typically have a length approximately equal to the length of the semiconductor die. As such, the extensions of the source lead are typically the only portion of the source lead that is in contact with the semiconductor die when the semiconductor device is assembled, and the extensions of the gate lead are typically the only portion of the gate lead that is in contact with the semiconductor die when the semiconductor device is assembled. The insulator 32 may be adhesively affixed to the source lead 34 and the gate lead 30, with the insulator typically centered on the interlaced extensions of the source and gate leads. The adhesive affixation of the insulator 32 to the source and gate leads may prevent the extensions 38 of the source lead from contacting the extensions 36 of the gate lead, thereby preventing a short circuit that might damage the semiconductor device: If the insulator 32 is not adhesively affixed to the source lead 34 and the gate lead 30, some other technique may be used to prevent contact of the interlaced extensions.

Figure 4:
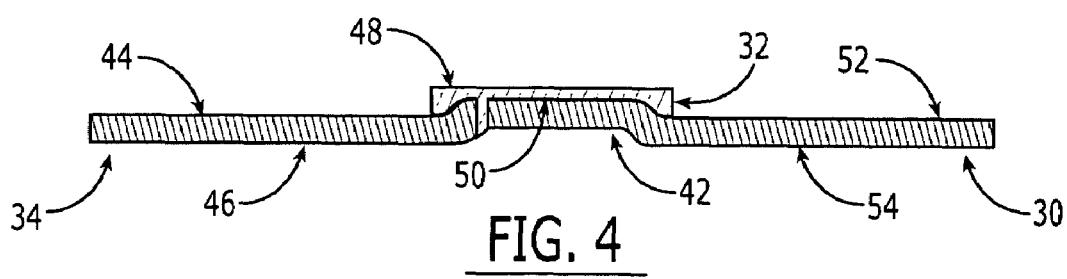
FIG. 4 is a front side view of the source and gate leads and insulator of FIG. 3.

FIG. 4 is a front side view of the source and gate leads and insulator of FIG. 3. A shallow (1-2 mil deep) recess 42 may be formed in the interlaced extensions of the source and gate leads. The recess may be formed by etching, stamping, or any other suitable method. The length and width of the shallow recess will typically be slightly larger than the length and width of the semiconductor die, such that a portion of the semiconductor die (i.e., the top surface) will fit within the recess when the components are assembled and compressive force is applied, thereby restricting movement of the die relative to the source and gate leads and reducing the compressive force required to hold the components together. Depending on the method used to form the recess in the interlaced extensions of the source and gate leads, the sides of the source and gate leads that are not adjacent to the semiconductor die and that are adjacent to the insulator 32 when the semiconductor device is assembled (i.e., the top surface 44 of the source lead and the top surface 52 of the gate lead) may form a projection corresponding to the recess that is formed on the sides that are adjacent to the semiconductor die. For example, if the recess is formed by stamping, the sides opposite the recess would typically form a corresponding projection. The recess 42 of the source and gate leads of FIG. 4 illustrates a recess that may be formed by stamping, such that the sides opposite the recess (i.e., the top surfaces 44 and 52) form a projection. If the recess is formed by etching, the sides opposite the recess would typically be flat.

The surface 50 of the insulator that is adjacent to the sides of the source and gate leads opposite the recess may also have a shallow recess. The insulator would typically have a recess if the source and gate leads have a projection, such that the projection of the source and gate leads will fit within the recess of the insulator when the components are assembled and compressive force is applied, thereby restricting movement of the insulator relative to the source and gate leads and reducing the compressive force required to hold the components together. FIG. 4 illustrates an insulator that has a recess to accept a projection of the source and gate leads.

Holding the components together with a compressive force, rather than by the typical method of metallic bonding (i.e., welding), eliminates problems of physical stress caused when the different components expand at different rates. As in the embodiment illustrated in FIGS. 1-4, the insulators may be adhesively affixed to the leads, such as by gluing, such that the source lead and the gate lead are affixed to one insulator, and the drain lead is affixed to another insulator. Because the glue forms an elastic (i.e., flexible) bond between the lead(s) and the insulator, the unequal thermal expansion would typically not cause physical stress capable of damaging the semiconductor device.

FIG. 5 is a top perspective view and FIG. 6 is a bottom perspective view of a semiconductor die, according to one embodiment of the invention. The die comprises at least a top surface 64 (shown in FIG. 5) and a bottom surface 66 (shown in FIG. 6), although again the orientational designations are for purposes of illustration and not limitation. When the semiconductor device is assembled, the top surface 64 of the semiconductor die will typically be in contact with the extensions 38 of the source lead and the extensions 36 of the gate lead. The top surface 64 may fit within the recess 42 that may be formed in the interlaced extensions of the source and gate leads, thereby restricting movement of the semiconductor die 62 relative to the source and gate leads. When the semiconductor device is assembled, the bottom surface 66 of the semiconductor die will typically be in contact with the top surface 16 of the drain lead 10. The bottom surface 66 may fit within the recess 14 that may be formed in the drain lead, thereby restricting movement of the semiconductor die 62 relative to the drain lead.

FIG. 7 is a top perspective view and FIG. 8 is a bottom perspective view of a semiconductor device, according to one embodiment of the invention. The semiconductor device 60 comprises a semiconductor die 62, a drain lead 10, an insulator 12 (which may be adhesively affixed to the drain lead), a source lead 34, a gate lead 30, and an insulator 32 (which may be adhesively affixed to the extensions of the source lead and the drain lead). The components of the semiconductor device 60 are typically stacked together as illustrated in FIGS. 7 and 8, such that the top surface 20 of the insulator 12 may be in contact with the bottom surface 18 of the drain lead 10, such that the top surface 16 of the drain lead may be in contact with the bottom surface 66 of the semiconductor die 62, such that the top surface 64 of the semiconductor die may be in contact with the bottom surface 46 of the source lead 34 and in contact with the bottom surface 54 of the gate lead 30, and such that the top surface 44 of the source lead and the top surface 52 of the gate lead may be in contact with the bottom surface 50 of the insulator 32. The semiconductor device 60 is typically held together by compressive force applied to the bottom surface 22 of insulator 12 and applied to the top surface 48 of insulator 32.

The semiconductor device 60 of FIGS. 7 and 8 may function as a field effect transistor, such that a small voltage applied across the gate lead 30 and the source lead 34 may cause current to flow between the source lead 34 and the drain lead 10. The semiconductor device 60 has several advantages over known semiconductor devices. The semiconductor device 60 is capable of dissipating heat from two sides. Heat may be dissipated through insulator 12 and through insulator 32 (as discussed above, insulator 12 and insulator 32 are electrically insulative but thermally conductive), thereby enabling dissipation of approximately twice as much heat as may be dissipated by a known semiconductor device capable of only single-side heat dissipation. Greater heat dissipation enables the semiconductor device to handle greater current and thereby greater power, or enables a smaller semiconductor device to be used in a particular application.

The semiconductor device 60 eliminates problems associated with bonding the leads to the semiconductor die. Because the leads are held in physical and electrical contact with the semiconductor die by compressive force rather than being welded, the leads and the die can expand at differing rates without causing physical stress that may damage the semiconductor device. Additionally, because area of contact between each lead and the semiconductor die of semiconductor device 60 is much greater than the area of contact between each lead and the semiconductor die of a known semiconductor device (which, as discussed above, is typically a small bonding point), the current flow between each lead and the semiconductor die occurs over a greater area, thereby causing a more even temperature excursion across the surface of the semiconductor die and avoiding micro-hotspots (i.e., areas of higher localized temperature). Current crowding produces localized increased power loss ($P_{loss}=IR^2$) which causes micro-hotspots and therefore higher physical stresses, compared to a more even distribution of current. Also, the electrical leads in the exemplary embodiments of the invention are thicker that the conventional metalized layer of a semiconductor. The thickness of the leads helps reduce the likelihood of micro-hot-spots occurring.

Figure 9:
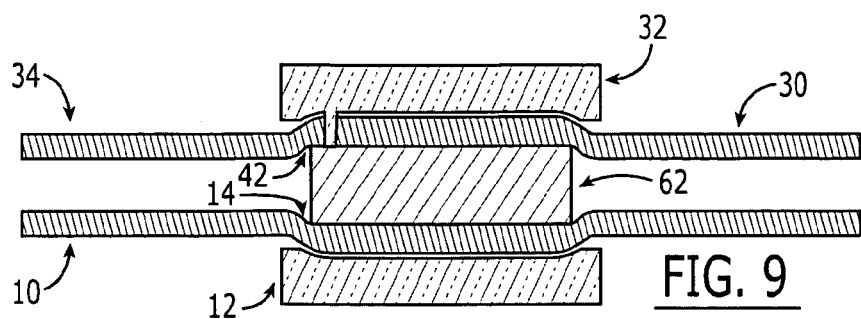
FIG. 9 is a sectional view of the semiconductor device of FIG. 7.
Figure 10:
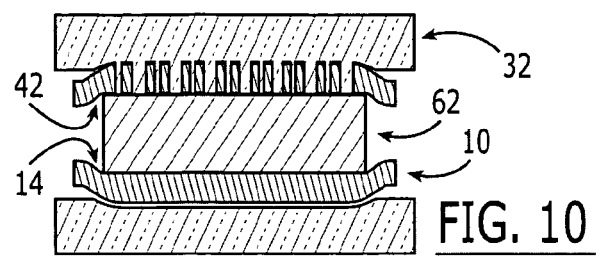
FIG. 10 is a sectional view of the semiconductor device of FIG. 7.

FIGS. 9 and 10 are sectional views of the semiconductor device of FIG. 7. FIGS. 9 and 10 illustrate the semiconductor die 62 partially contained within recess 14 and recess 42, thereby restricting movement of the semiconductor die relative to the drain lead 10, the source lead 34 and the gate lead 30.

Figure 11:
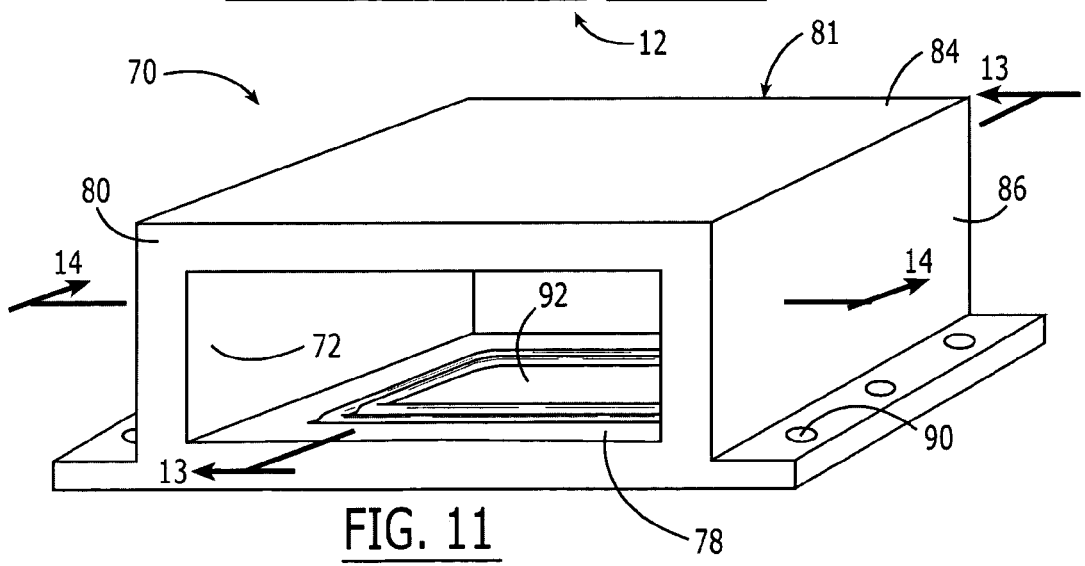
FIG. 11 is a top perspective view of a semiconductor cooling apparatus, according to one embodiment of the invention.
Figure 12:
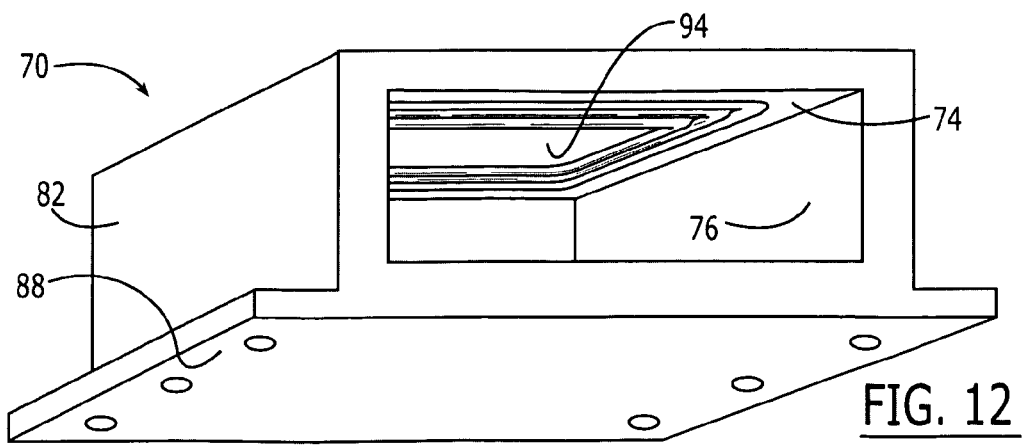
FIG. 12 is a bottom perspective view of a semiconductor cooling apparatus, according to one embodiment of the invention.

FIG. 11 is a top perspective view and FIG. 12 is a bottom perspective view of a semiconductor cooling apparatus, according to one embodiment of the invention. The semiconductor cooling apparatus may be, for example, a heat pipe or similar device. The cooling apparatus 70 comprises an inner surface defining a void within the cooling apparatus, within which a semiconductor device, such as described above, may be disposed and compressively and thermally engaged. The inner surface generally comprises an inner top surface 74, an inner bottom surface 78, an inner first side surface 72, and an inner second side surface 76. The cooling apparatus further comprises an outer surface surrounding the inner surface such that the inner surface and the outer surface define a cavity between the inner surface and the outer surface. The outer surface comprises an outer top surface 84, an outer bottom surface 88, an outer first side surface 82, and an outer second side surface 86. The cooling apparatus further comprises a first end surface 80 and a second end surface 81 to enclose the cavity defined between the inner surface and the outer surface. The cooling apparatus further comprises a top flexible element 94 and a bottom flexible element 92. The flexible elements may be, for example, a bellows or similar device. The perimeter of the top flexible element 94 is affixed to the perimeter of an opening defined within the inner top surface 74. The perimeter of the bottom flexible element 92 is affixed to the perimeter of an opening defined within the inner bottom surface 78. The void defined by the inner surface is capable of receiving a semiconductor device 60 such that the top surface 48 of insulator 32 of the semiconductor device is in contact with the top flexible element 94 and the bottom surface 22 of insulator 12 of the semiconductor device is in contact with the bottom flexible element 92. The flexible elements in FIGS. 11 and 12 are generally rectangular in shape, corresponding to the shape of the insulator surfaces that will be in contact with the flexible elements. The shape of the insulators and thus of the flexible elements may vary.

A cooling medium may be disposed within the cavity defined between the inner surface and the outer surface. The cooling medium may be, for example, working liquid within a heat pipe. A sufficient amount of the cooling medium will typically be disposed within the cavity to cause the cooling medium to exert an outward pressure against the surfaces of the cooling assembly. The outward pressure exerted by the cooling medium within the cavity causes the top flexible element 94 and the bottom flexible element to flex toward the semiconductor device to apply a compressive force to the semiconductor device. Additionally, changes in the operating temperature of the semiconductor device cause corresponding changes in the pressure of the cooling medium, such that an increased temperature typically causes increased pressure, increased flex of the flexible elements, and increased compressive force to the semiconductor device. The top and bottom flexible elements may flex approximately 5-10 mils toward the semiconductor device, although other embodiments may have more or less flex so long as the semiconductor device is securely retained by the compressive force. The cooling medium is typically selected such that the cooling medium is partially liquid and partially vapor at the defined operating temperature range of the semiconductor device. The cooling medium may be, for example, water, alcohol, or sodium. The cooling medium will typically initially be entirely liquid. As heat generated by electrical current flowing through the semiconductor device is transferred through the top flexible element and the bottom flexible element to the cooling medium, the liquid begins to vaporize. As the liquid vaporizes, the pressure within the cavity increases, and the increased pressure halts vaporization. As described above, the increased pressure may cause the cooling medium to exert a pressure against the top and bottom flexible elements, in turn causing the flexible elements to flex toward and apply a compressive force to the semiconductor device. The cooling apparatus 70 would typically be mounted to an actively cooled device, such as a cold plate, via mounting holes 90. Heat that is transferred from the semiconductor device through the top and bottom flexible elements to the cooling medium would then be transferred from the cooling medium through the outer bottom surface 88 to the cold plate.

Figure 13:
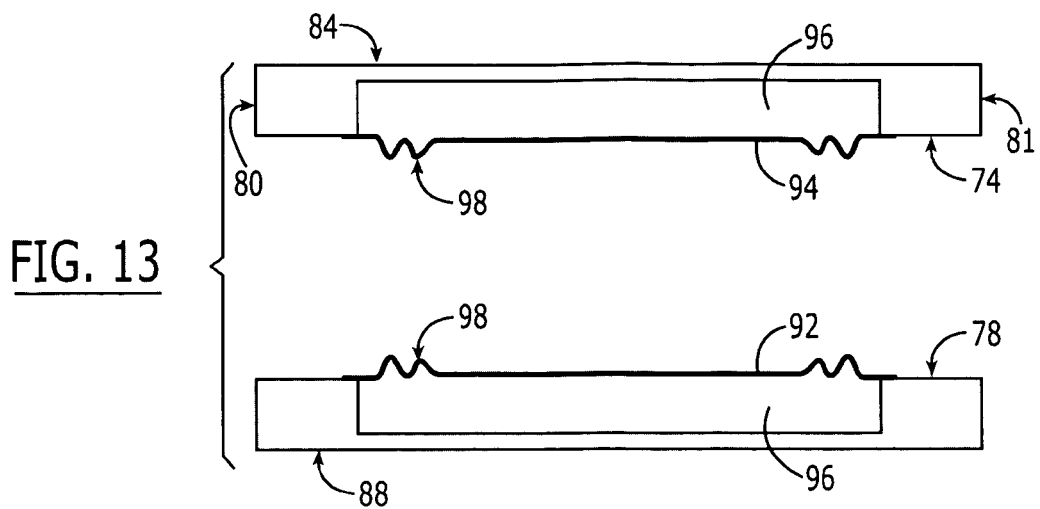
FIG. 13 is a sectional view of the semiconductor cooling apparatus of FIG. 11.
Figure 14:
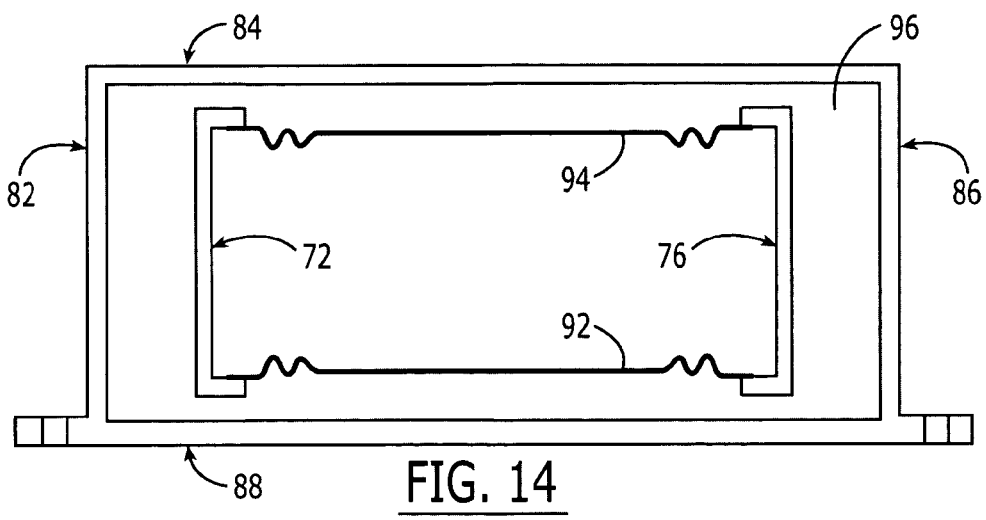
FIG. 14 is a sectional view of the semiconductor cooling apparatus of FIG. 11.

FIGS. 13 and 14 are sectional views of the semiconductor cooling apparatus of FIG. 11. FIGS. 13 and 14 illustrate the corrugations 98 in both the top flexible element 94 and the bottom flexible element. The corrugations enable the top and bottom flexible elements to flex toward a semiconductor device disposed within the cooling apparatus when the cooling medium is inserted into the cavity 96. The flexible elements illustrated in FIGS. 13 and 14 each have two corrugations. The number of corrugations may vary, depending on the desired amount of flex.

Figure 15:
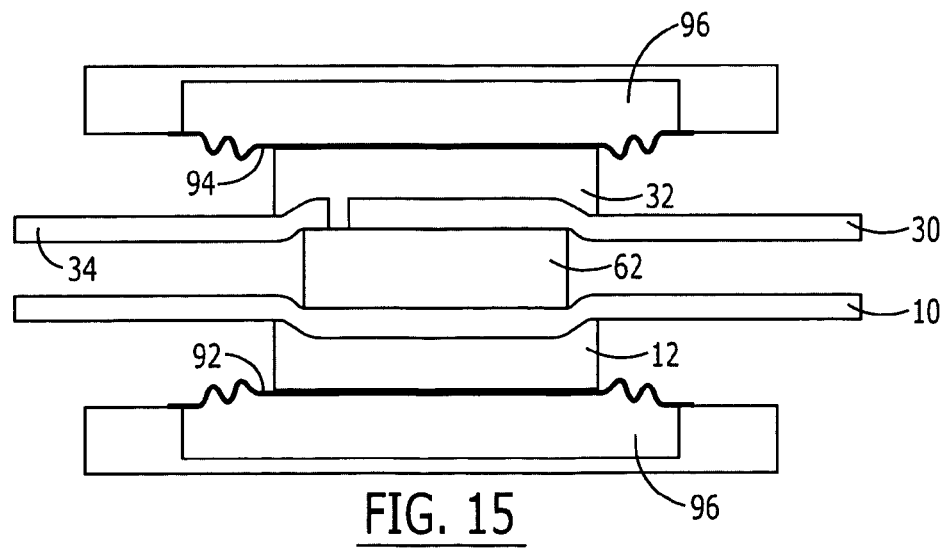
FIG. 15 is a sectional view of the semiconductor cooling apparatus of FIG. 11, with a semiconductor device and the lead assembly of the device inserted in the cavity.
Figure 16:
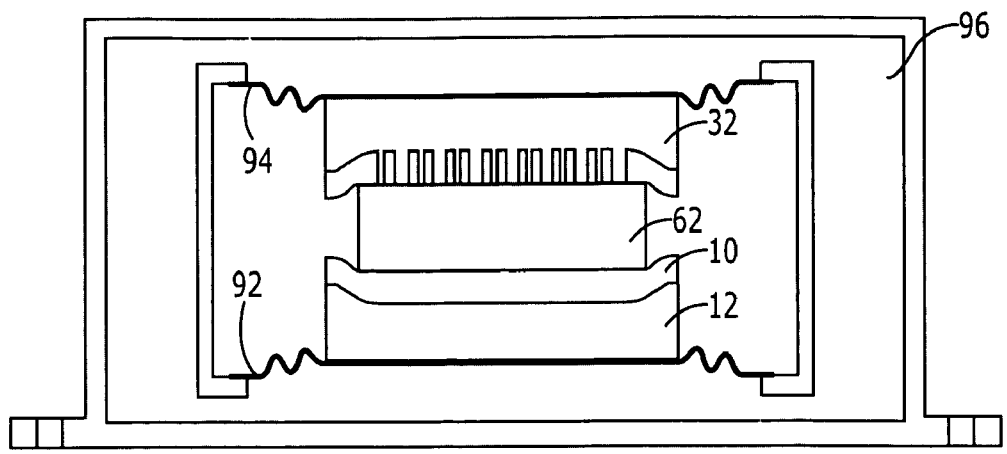
FIG. 16 is a sectional view of the semiconductor cooling apparatus of FIG. 11, with a semiconductor device and the lead assembly of the device inserted in the cavity.

FIGS. 15 and 16 are sectional views of the semiconductor cooling apparatus of FIG. 11 with a semiconductor device disposed within the void formed by the inner surface of the cooling apparatus. The bottom insulator 12 of the semiconductor device is in contact with the bottom flexible element 92 of the cooling apparatus and the top insulator 32 is in contact with the top flexible element 94 of the cooling apparatus. When the cooling medium is inserted into cavity 96, the cooling medium causes the top and bottom flexible elements to flex toward the semiconductor device as illustrated in FIGS. 15 and 16. The top and bottom flexible elements apply a compressive force to the top insulator 32 and the bottom insulator 12, which in turn apply the compressive force to the source lead 34, the gate lead 30, and the drain lead 10, thereby causing the leads to maintain physical and electrical contact with the semiconductor die 62. A portion of each of the leads typically extend outside of the cavity of the cooling apparatus, such that the leads may be electrically connected to circuitry outside of the cooling apparatus.

Figure 17:
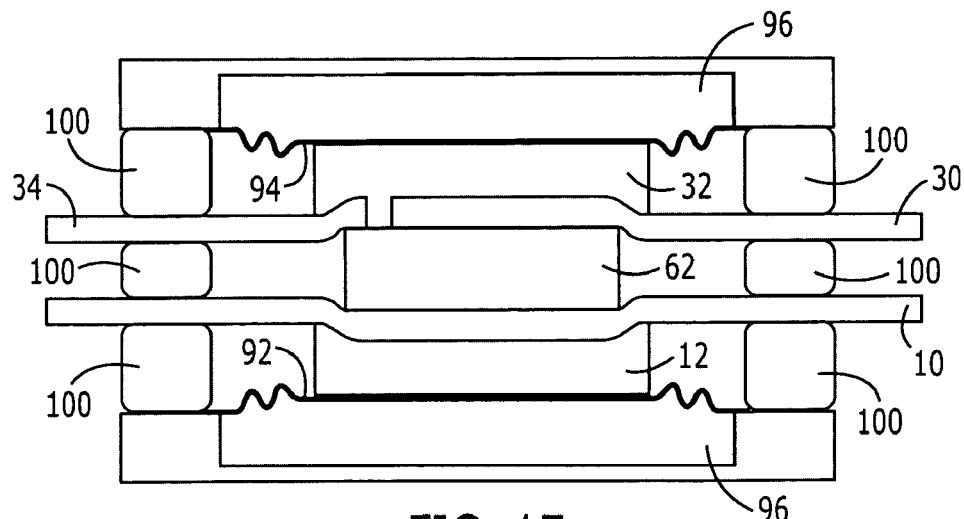
FIG. 17 is a sectional view of a semiconductor cooling apparatus with hermetic sealing, according to one embodiment of the invention.

FIG. 17 is a sectional view of a semiconductor cooling apparatus with hermetic sealing, according to one embodiment of the invention. The cooling apparatus and semiconductor device may be placed in an environment in which the semiconductor device may be exposed to moisture or other contaminants that may adversely affect the performance and/or reliability of the semiconductor device. It may be desirable to protect the semiconductor device from exposure to such contaminants. One technique of protecting the semiconductor device is to hermetically seal the semiconductor within the void of the cooling apparatus by applying a sealing material 100, such as an epoxy or any other suitable sealing material as is known in the art, around the leads of the semiconductor device. The sealing material is typically placed between the leads and the inner surface of the cooling apparatus to form a hermetic seal that prevents contaminants from entering the void of the cooling apparatus.

Figure 18:
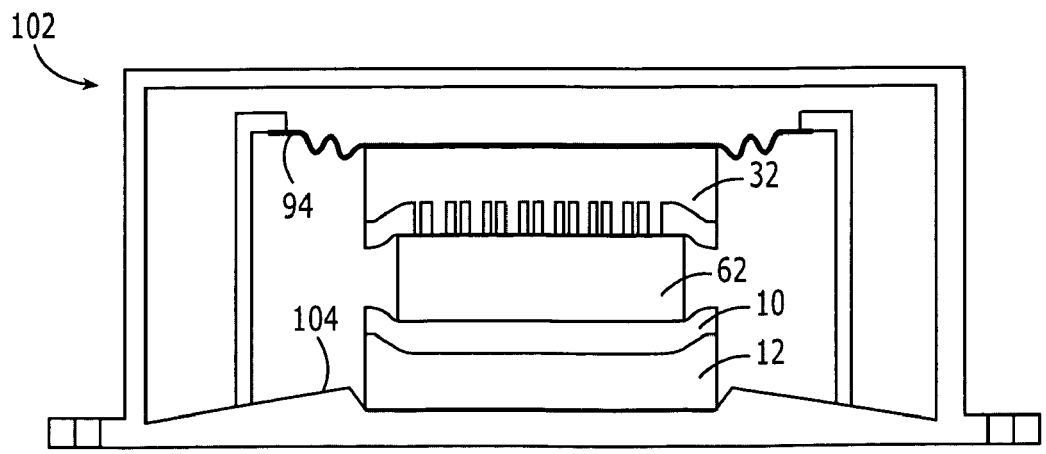
FIG. 18 is a sectional view of a semiconductor cooling apparatus with a single flexible element, according to one embodiment of the invention.

FIG. 18 is a sectional view of a semiconductor cooling apparatus, according to an alternative embodiment of the invention. The cooling apparatus 102 has one flexible element, which is a top flexible element 94. The bottom surface 104 does not have a flexible element in this embodiment, such that the compressive force is only applied to the semiconductor device by the top flexible element. The compressive force applied by the top flexible element holds the semiconductor device between the top flexible element and the bottom surface 104. The bottom surface 104 of the cooling apparatus may have a shallow recess sized to receive the bottom surface of the insulator 12, thereby restricting movement of the insulator 12 relative to the cooling apparatus.

Figure 19:
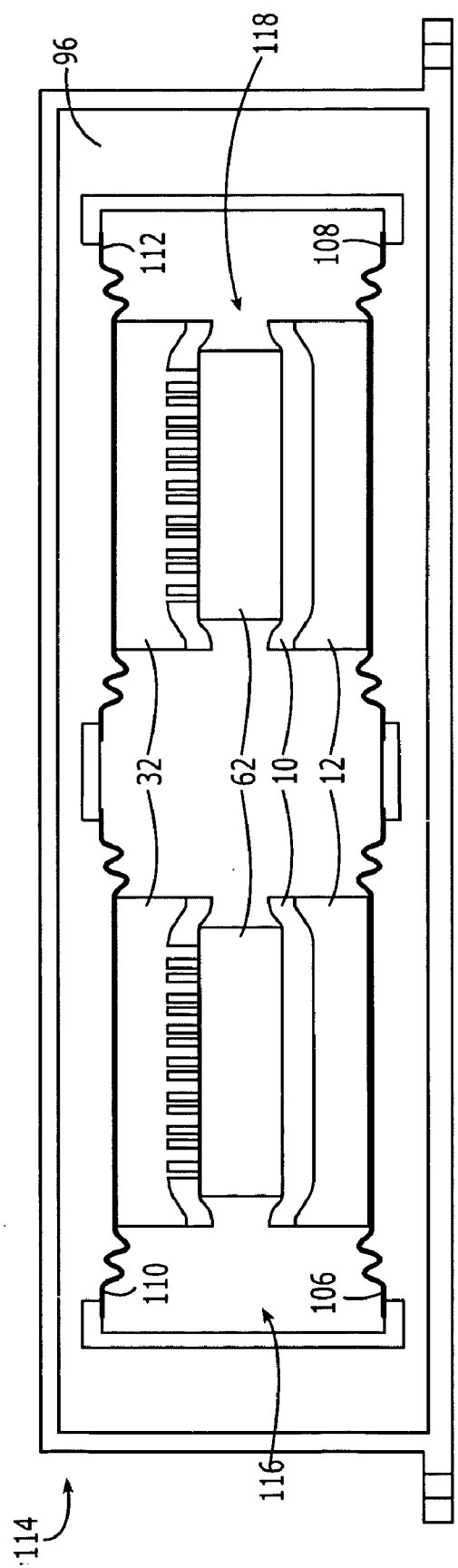
FIG. 19 is a sectional view of a semiconductor cooling apparatus and two semiconductor devices, according to one embodiment of the invention.

FIG. 19 is a sectional view of a semiconductor cooling apparatus, according to an alternative embodiment of the invention. The semiconductor cooling apparatus 114 is capable of accepting two semiconductor devices. The semiconductor cooling apparatus 114 comprises a first bottom flexible element 106, a second bottom flexible element 108, a first top flexible element 110, and a second top flexible element 112. A first semiconductor device 116 may be held by the first bottom flexible element 106 and the first top flexible element 110. A second semiconductor device 118 may be held by the second bottom flexible element 108 and the second top flexible element 112. Heat from the first semiconductor devices may be transferred through the first top and first bottom flexible elements to a cooling medium in the cavity 96, and heat from the second semiconductor devices may be transferred through the second top and second bottom flexible elements to the cooling medium. In other embodiments of the invention, the semiconductor cooling apparatus may be capable of accepting more than two semiconductor devices, with the cooling apparatus comprising a top flexible element and a bottom flexible element for each semiconductor device. Alternatively, a semiconductor cooling apparatus capable of accepting two or more semiconductor devices may have only one top flexible element and one bottom flexible element, each sized to accommodate the plurality of semiconductor devices such that the top flexible element and the bottom flexible element provide the compressive force to all of the semiconductor devices disposed within the cooling assembly.

In a semiconductor cooling apparatus containing two or more semiconductor devices, the leads of each semiconductor device may connect only with circuitry outside the cooling apparatus, such that each semiconductor device functions separately from the other semiconductor devices in the cooling apparatus. Alternatively, one or more leads of a semiconductor device in the cooling apparatus may be connected with leads of other semiconductor devices in the cooling apparatus, such that the semiconductor devices function together as a single unit. A cooling apparatus containing two or more semiconductor devices that are interconnected and which function together may be termed collectively a semiconductor module.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A semiconductor apparatus comprising:
   a cooling apparatus: and
   a semiconductor device engaged by the cooling apparatus such that the cooling apparatus both applies a compressive force to and is in thermal communication with the semiconductor device, the semiconductor device comprising:
   a semiconductor die comprising at least first and second surfaces;
   a first electrically-conductive lead held in contact with the first surface of the semiconductor die by the compressive force applied by the cooling apparatus and without any bond to the semiconductor die;
   a first thermally-conductive, electrically-insulative element in thermal contact with a portion of the first electrically-conductive lead and with the cooling apparatus such that the first thermally-conductive, electrically-insulative element is capable of removing heat from the first electrically-conductive lead and from the semiconductor die;
   a second electrically-conductive lead held in contact with the second surface of the semiconductor die by the compressive force applied by the cooling apparatus and without any bond to the semiconductor die; and
   a second thermally-conductive, electrically-insulative element in thermal contact with a portion of the second electrically-conductive lead and with the cooling apparatus such that the second thermally-conductive, electrically-insulative element is capable of removing heat from the second electrically-conductive lead and from the semiconductor die.

2. The semiconductor apparatus of claim 1, further comprising a third electrically-conductive lead held in contact with the second surface of the semiconductor die by the compressive force applied by the cooling apparatus and without any bond to the semiconductor die, wherein the second thermally-conductive, electrically-insulative element is in contact with a portion of the third electrically-conductive lead such that the second thermally-conductive, electrically-insulative element is capable of removing heat from the third electrically-conductive lead.

3. The semiconductor apparatus of claim 2, wherein the first electrically-conductive lead is capable of functioning as a semiconductor drain, wherein the second electrically-conductive lead is capable of functioning as a semiconductor gate, and wherein the third electrically-conductive lead is capable of functioning as a semiconductor source.

4. The semiconductor apparatus of claim 2, wherein the first electrically-conductive lead is capable of functioning as a semiconductor collector, wherein the second electrically-conductive lead is capable of functioning as a semiconductor base, and wherein the third electrically-conductive lead is capable of functioning as a semiconductor emitter.

5. The semiconductor apparatus of claim 2, wherein the second and third electrically-conductive leads each comprise a plurality of extensions; and wherein the extensions of the second electrically-conductive lead are interlaced with the extensions of the third electrically-conductive lead.

6. The semiconductor apparatus of claim 2, wherein the portion of the first electrically-conductive lead that is held in contact with the first surface of the semiconductor die is recessed to accept the first surface of the semiconductor die; and wherein the portions of the second and third electrically-conductive leads that are held in contact with the second surface of the semiconductor die are recessed to accept the second surface of the semiconductor die.

7. The semiconductor apparatus of claim 2, wherein the first thermally-conductive, electrically-insulative element is adhesively affixed to the portion of the first electrically-conductive lead; wherein the second thermally-conductive, electrically-insulative element is adhesively affixed to both the portion of the second electrically-conductive lead and the portion of the third electrically-conductive lead.

8. A semiconductor cooling apparatus comprising:
   an inner surface defining a void and further defining an opening that opens into the void;
   an outer surface surrounding the inner surface such that the inner surface and the outer surface define a cavity between the inner surface and the outer surface;
   a flexible element; and
   a cooling medium within the cavity defined between the inner surface and the outer surface, the cooling medium being in operable contact with the flexible element so as to cause the flexible element to flex into the void;
   wherein the flexible element is affixed to the inner surface so as to extend across and cover the opening defined by the inner surface; wherein the void defined by the inner surface is sized to receive a semiconductor device such that a surface of the semiconductor device is in operable contact with the flexible element; wherein the cooling medium within the cavity causes the flexible element to flex toward the semiconductor device to apply a compressive force to the semiconductor device so as to retain the semiconductor device within the void; and wherein heat generated by electrical current flowing through the semiconductor device is transferred through the flexible element to the cooling medium.

9. The semiconductor cooling apparatus of claim 8, further comprising:
a second flexible element;
wherein the second flexible element is affixed to the inner surface so as to extend across and cover another opening defined by the inner surface such that another surface of the semiconductor device is in contact with the second flexible element; wherein the cooling medium within the cavity causes the second flexible element to flex toward the semiconductor device to apply a compressive force to the semiconductor device; and wherein heat generated by electrical current flowing through the semiconductor device is transferred through the second flexible element to the cooling medium.

10. The semiconductor cooling apparatus of claim 8, further comprising:
a cold plate in thermal contact with the outer surface such that heat transferred to the cooling medium is further transferred from the cooling medium to the cold plate.

11. The semiconductor cooling apparatus of claim 8, wherein the cooling medium is selected such that the cooling medium will be partially liquid and partially vapor at an operating temperature range of the semiconductor device.

12. The semiconductor cooling apparatus of claim 8, wherein the flexible element comprises at least one corrugation to enable the flexible element to flex toward the semiconductor device, and wherein the second flexible element comprises at least one corrugation to enable the second flexible element to flex toward the semiconductor device.

\* \* \* \* \*